United States Patent [19]

Belopolsky

[11] Patent Number: 5,272,375

[45] Date of Patent: Dec. 21, 1993

[54] ELECTRONIC ASSEMBLY WITH OPTIMUM HEAT DISSIPATION

[75] Inventor: Yakov Belopolsky, Hockessin, Del.

[73] Assignee: E. I. Du Pont de Nemours and Company, Wilmington, Del.

[21] Appl. No.: 814,024

[22] Filed: Dec. 26, 1991

[51] Int. Cl.$^5$ .................. H01L 23/02; H01L 39/02
[52] U.S. Cl. ........................ 257/717; 257/712; 174/16.3; 165/80.2; 165/104.33; 361/704; 361/707
[58] Field of Search ............ 257/712, 717, 713; 361/386, 388; 174/16.3; 165/80.2, 104.33

[56] References Cited

U.S. PATENT DOCUMENTS

| | | |
|---|---|---|
| 4,069,497 | 1/1978 | Steidlitz . |
| 4,509,096 | 4/1985 | Baldwin et al. . |
| 4,510,519 | 4/1985 | Dubois et al. ............... 257/717 |
| 4,626,203 | 2/1987 | Ngo et al. . |
| 4,631,819 | 12/1986 | Lasier et al. . |
| 4,685,987 | 8/1987 | Fick ............................. 257/717 |
| 4,729,061 | 3/1988 | Brown . |
| 4,782,893 | 11/1988 | Thomas . |
| 4,901,137 | 2/1990 | Sato et al. ................... 257/717 |
| 4,963,414 | 10/1990 | LeVasseur et al. . |
| 5,043,796 | 8/1991 | Lester ......................... 257/717 |

Primary Examiner—Rolf Hille
Assistant Examiner—David Ostrowski

[57] ABSTRACT

An electronic assembly contains a semiconductor chip, a metal heat spreading layer, a dielectric layer and a metal heat sink wherein superior heat dissipation is present.

6 Claims, 4 Drawing Sheets

ELECTRONIC ASSEMBLY WITH OPTIMUM HEAT DISSIPATION

FIELD OF THE INVENTION

This invention relates to an assembly which can be used in electronic applications. More particularly it relates to an assembly with good thermal conductance which includes one or more semiconductor chips.

BACKGROUND OF THE INVENTION

Thermal management in semiconductor packages is a problem common to electronic products in the computer, telecommunications, automotive and other industries. Semiconductor chips, and in particular power transistors, generate considerable heat in operation. Metal plates, or heat sinks, are frequently used in packages or assemblies to improve heat removal from the semiconductor chips. However, in most cases the chip must be electrically insulated from the heat sink. Thus a layer of dielectric material must be placed between the chip and the heat sink. Since most dielectric materials have low thermal conductivity, the efficiency of the heat sink is limited. This problem can largely be overcome by the use of beryllia as the dielectric material, since beryllia has both good dielectric properties and good thermal conductivity. However, beryllia is a highly toxic material as well as very expensive. Its use has been severely restricted in many consumer products. Therefore, there is a need for a semiconductor chip assembly which has thermal dissipation properties approaching that of assemblies containing beryllia-based dielectric layers, but which does not use toxic or excessively expensive materials.

SUMMARY OF THE INVENTION

This invention provides an electronic assembly comprising in order:

(a) a semiconductor chip having a surface area $A_C$,
(b) a metal heat spreading layer having a first edge and a second edge, said heat spreading layer having a thickness T and a surface area $A_M$, where $A_M > A_C$,
(c) a layer of an electrically insulating dielectric material having a surface area $A_D$, where $A_D > A_M$, and
(d) a metal heat sink layer having a surface area $A_S$, where $A_S > A_D$, wherein said chip is located at a distance $D_1$ from the first edge of the metal heat spreading layer and a distance $D_2$ from the second edge of the metal heat spreading layer and angles $\phi_1$, $\phi_2$ and $\phi_{ave}$ are defined by the relationships $$\tan \phi_1 = \frac{T}{D_1}$$

$$\tan \phi_2 = \frac{T}{D_2}$$

$$\phi_{ave} = 1/2[\phi_1 + \phi_2]$$

wherein angle $\phi$ is the angle inscribed by (1) a line from an edge of the chip to the edge of an upper surface of the heat spreading layer, which is parallel to a surface of the heat spreading layer, and (2) a line connecting an edge of the chip to an edge of a lower surface of the heat spreading layer, angle $\phi_1$ is the angle using the smallest distance, $D_1$ and angle $\phi_2$ is the angle using the largest distance $D_2$ and further wherein one of the following dimensional relationships exists:

(1) T=5−9 mils and $\phi_{ave}$=2° to 3°,
(2) 9<T<15 mils and $\phi_{ave}$=4° to 9°, or
(3) T=15−20 mils and $\phi_{ave}$=7° to 8°.

DETAILED DESCRIPTION OF THE INVENTION

Figure 1:
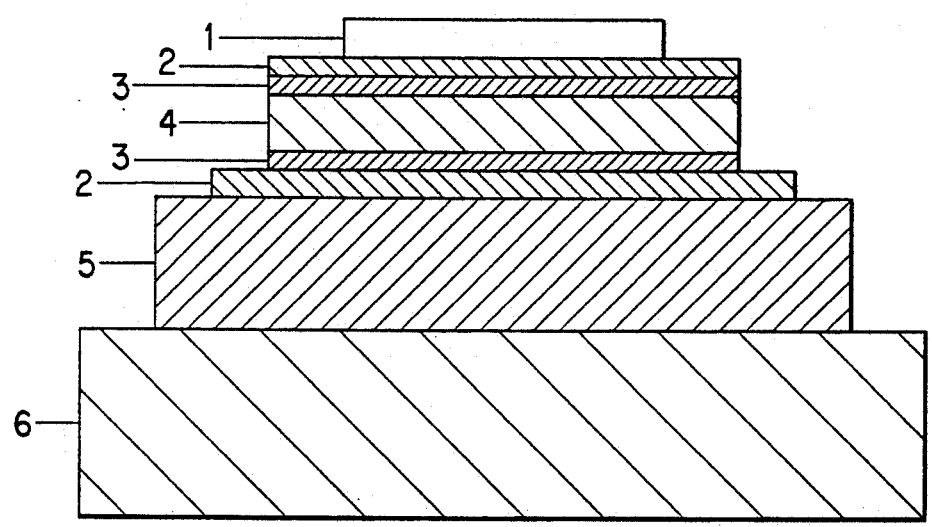
FIG. 1 is a cross-sectional view of a prior art assembly.

The present invention relates to an electronic assembly including at least one semiconductor chip. The assembly has good thermal conductance and does not include toxic materials. The assembly comprises a large metal heat sink, at least one smaller metal heat spreading layer (heat spreader) and at least one chip. The heat sink and the heat spreader are separated by a dielectric layer. Surprisingly, it has been found that optimum heat dissipation can be achieved by choosing the dimensions of the heat spreading layer so that the surface area, the thickness and the spatial relationship of the heat spreader to the chip are within certain range limitations.

The semiconductor chips which can be used in the assembly of the invention can be of any kind, although the assembly is particularly useful when power transistors are used. The chips are generally rectangular or square those of standard size, i.e., from 100×100 mils (0.25×0.25 cm) to 400×400 mils (1.0×1.0 cm) in surface area. The usual thickness of the chip is about 20 to 25 mils (0.051 to 0.064 cm).

The metal that can be used for the heat spreader which likewise is generally rectangular or square with edges parallel to the semiconductor chip is any thermally conductive metal. Typically copper or aluminum is used. Copper is the preferred metal for the heat spreader. The heat spreader should have a thickness in the range of about 5 to about 20 mils (0.013 to 0.051 cm), preferably about 9 to about 15 mils (0.023 to 0.038 cm). The surface area of the heat spreader is greater than that of the semiconductor chip. It is preferred that the surface area be in the range of about 0.20 to about 0.30 square inches (1.29 to 1.94 square cm). The most common configuration for the heat spreader is a square surface geometry. While this is not strictly necessary, it will be appreciated that the best results will be obtained when the surface geometry of the heat spreader is similar to that of the semiconductor chip. This will be discussed in greater detail below in conjunction with a discussion of the drawings. The chip is attached to the heat spreading layer by any conventional means of attachment. Typically, solder is used to attach the chip to a copper heat spreader; epoxy is used to attach the chip to an aluminum heat spreader.

The dielectric material can be any of those electrically insulating materials commonly used in electronic applications. The dielectric material can be used with an adhesive or may itself act as an adhesive. Suitable materials include crosslinked acrylic resins, epoxy or polyimide resins, such resins reinforced with glass or aramid fabrics, and polyimide or polyamide films. The dielectric and/or adhesive material can be thermally and/or pressure activated. It can be a single layer or more than one layer. Preferred dielectric materials are B-stage epoxy resin and crosslinked acrylic resins such as described by Yuan in U.S. Pat. Nos. 3,728,150 and 3,822,175.

A particularly dielectric layer is an acrylic adhesive filled with thermally conductive particles. The adhesive composition comprises (a) 40-50% by weight, based upon the total amount of adhesive dry solids, of a latex comprising 90—90% by dry weight, based upon the latex dry components of an acrylate copolymer and 1-10% by dry weight, based upon the latex dry components, of a crosslinking agent and (b) 30-75% by weight, based upon the total amount of adhesive dry solids, of alumina particles. The latex comprising copolymer and crosslinking agent, component (a), is described in U.S. Pat. Nos. 3,728,150, 3,822,175 and 3,900,662. The copolymer should be a terpolymer and should comprise: (i) 15-50% by weight, based upon the weight of the copolymer, of acrylonitrile, methacrylonitrile or mixtures thereof, (ii) 45-84% by weight, based upon the weight of the copolymer, of butyl acrylate, ethyl acrylate, 2-ethylhexyl acrylate lauryl acrylate, lauryl methacrylate, octyl acrylate, heptyl acrylate, or mixtures thereof, and (iii) 1-5% by weight, based upon the weight of the copolymer, of methacrylic acid, acrylic acid, itaconic acid, or mixtures thereof. The crosslinking agent can be a resin such as melamine formaldehyde, phenol formaldehyde, or melamines such as hexamethoxymethyl melamine and the like. The copolymer should be present in an amount of about 90-99% by dry weight while the crosslinking agent is present in an amount of about 1-10% by dry weight. A preferred adhesive composition uses a copolymer of acrylonitrile/butyl acrylate/methacrylic acid in about a 35/60/5 ratio by weight mixed with 5% by dry weight of phenol formaldehyde.

The latex can be made by known addition polymerization techniques, such as those disclosed in U.S. Pat. No. 3,032,521.

The alumina particles are essentially spherical and at least 90% of the particles have a particle size in the range of about 1 to 3 micrometers. By "essentially spherical" it is meant that the particles have an aspect ratio no greater than 2. The sphericity makes it possible to add greater amounts of alumina particles without affecting the essential properties of the adhesive, particularly the flexibility. By using alumina particles which are essentially spherical, it is possible to add up to 75% of the particles to greatly improve the thermal conductivity, without causing the adhesive to become too brittle.

At least 90% of the alumina particles should have a size in the range of about 1 to 3 micrometers. If the particles are less than about 1 micrometers in size the surface are is increased to an extent leading to excessive interaction with the other components of the adhesive. This results in brittle adhesive compositions with poor adhesion. If the alumina particles are larger than about 3 micrometers, thin coatings of the adhesive will have a rough surface. When the bonding surface is not smooth, the adhesion is reduced. In addition, electrical problems can result. It is preferred that at least 95% of the particles fall in the size range of 1 to 3 micrometers.

It is further preferred that the alumina be alkoxide derived so that it is of high purity.

In order to achieve adequate thermal conductivity, the alumina can be added in an amount of from 30 to 75% by weight, based on the total amount of adhesive dry solids. The best balance of thermal conductivity and good adhesive properties is achieved with a preferred amount of 40-50% by weight, based on the total amount.

These adhesive compositions are prepared by first preparing latex component (a) as described above and then adding the alumina particles. The alumina can be added to the latex in the form of a solid which is then dispersed in the liquid or as a pre-made aqueous dispersion.

The dielectric layer should be thick enough to function as an electrical insulator and at the same time not overly limit thermal conductance. Generally, the dielectric layer is from 0.3 to 3.0 mils (0.00076 to 0.0076 cm) thick. The surface area of the dielectric layer must be larger than that of the heat spreader, i.e., there should be a border of dielectric material on all four sides that is not covered by the metal heat spreader. This prevents electrical discharge between the heat spreader and the heat sink, and is called the electrical discharge safety border. The size of the border should be at least three times the thickness of the dielectric layer or 0.005 inch (0.013 cm), whichever is greater.

The metal heat sink can made of any thermally conductive metal. As with the heat spreader, copper and aluminum are typically used. The final choice will depend on both thermal dissipation needs and cost considerations. The surface area of the heat sink is larger than that of the dielectric layer. The thickness of the heat sink is generally greater than 100 mils (0.25 cm).

It will be appreciated that a single metal heat sink can accommodate more than one semiconductor chip, each of which is mounted on an individual heat spreading layer. Similarly, more than one heat spreader can be placed on a given dielectric layer, as long as appropriate electrical insulation is maintained.

DETAILED DESCRIPTION OF THE DRAWINGS

The invention may be more readily understood by an examination of the drawings.

FIG. 1 is a cross-sectional view of a prior art substrate in which beryllia is used as the dielectric material. The beryllia dielectric 4 is coated on both sides with a thin layer of Mo-Mn, 3 in order to improve solderability. Semiconductor chip 1 is attached to the Mo-Mn layer 3 of the beryllia 4 by means of solder 2. The other side of the beryllia 4 is attached to a copper layer 5 by solder 2. Copper layer 5 is then attached to aluminum heat sink 6 by ultrasonic welding.

Figure 2A:
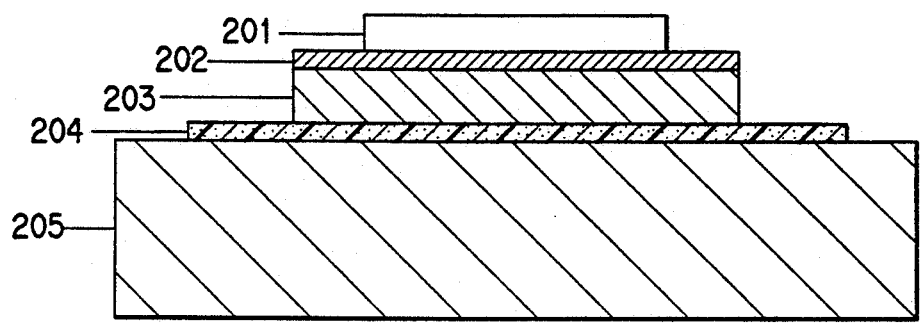
FIG. 2a is a cross-sectional view of one embodiment of the assembly of the invention.

FIG. 2a is a cross-sectional view of one embodiment of the invention. In this embodiment semiconductor chip 201 is attached by means of solder 202 to the heat spreading layer 203. The heat spreader 203 is attached to the larger heat sink 205 by means of a single adhesive dielectric layer 204. The dielectric layer 204 is larger in area than the heat spreader 203 so there is a border of dielectric material surrounding the heat spreader.

Figure 2B:
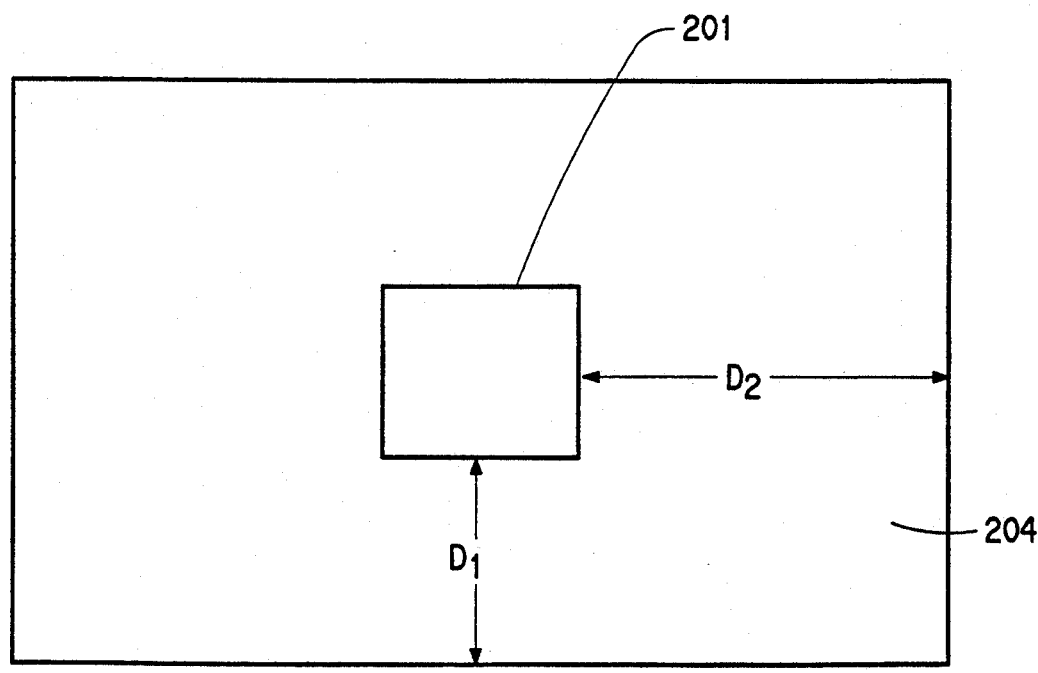
FIG. 2b is a planar view of the same embodiment of the assembly of the invention.

FIG. 2b is a planar view of the same structure, where the numbers refer to the same materials as in FIG. 2a. Semiconductor chip 201 is shown on the heat spreader layer 204. The edges of the chip are spaced at a distance $D_1$ and $D_2$ from the edges of the heat spreading layer. If the heat spreading layer were square, $D_1$ would be equal to $D_2$. Although the chip will usually be placed symmetrically on the heat spreading layer, and it is preferred to do so, it is possible that it be placed in a nonsymmetrical position. In such a case, $D_1$ is taken to be the shortest distance between an edge of the chip and the closest edge of the heat spreading layer; $D_2$ is taken to be the longest distance between an edge of the chip and the closest edge of the heat spreading layer. If the chip is placed on the heat spreading layer such that the edges of the chip are not parallel to the edges of the heat spreading layer, then the distance D for any given edge of the chip is taken as the average of the shortest distance between that edge and the closest edge of the heat spreading layer, and the greatest distance between that edge and the same edge of the heat spreading layer. Thus, if an edge were placed such that the closest point between that edge and the an edge of the heat spreading layer was 0.2 mil, and the farthest distance of that edge from the same edge of the heat spreading layer was 0.3 mil, the value of D for that edge would be 0.25 mil.

Figure 2C:
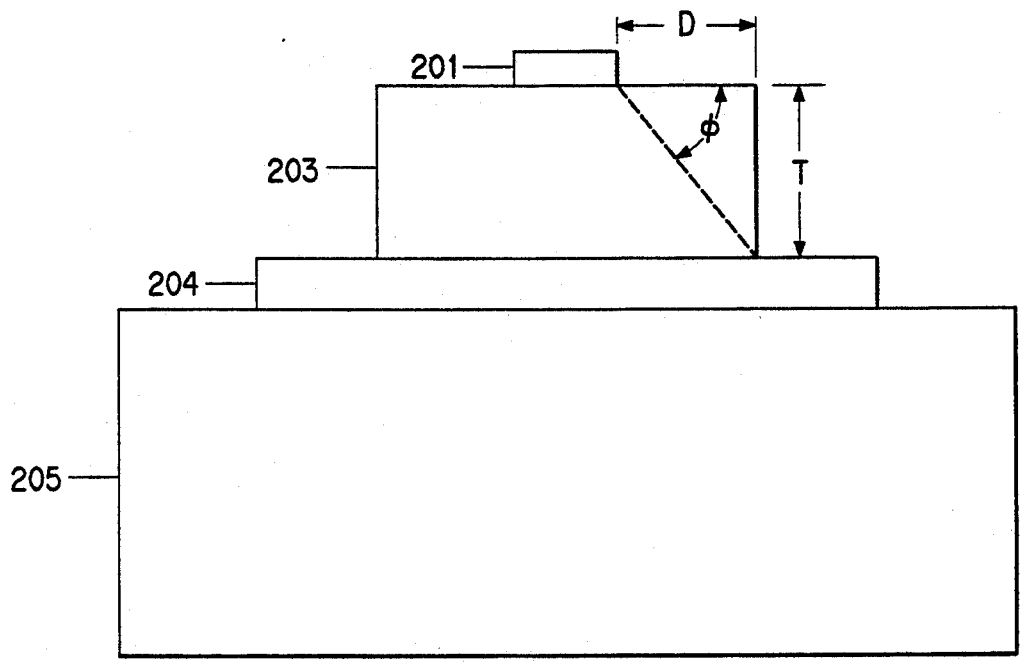
FIG. 2c is a second cross-sectional view of the same embodiment of the assembly of the invention.

FIG. 2c is a cross-sectional view of the same structure, which illustrates the angle $\phi$. Angle $\phi$ is the angle inscribed by (1) a line from the edge of the chip to the edge of the upper surface of the heat spreading layer (i.e., the surface forming the chip), which is parallel to the surface of the heat spreading layer, and (2) a line connecting the edge of the chip to the edge of the lower surface of the heat spreading layer (i.e., the surface forcing toward the chip). The tangent of angle $\phi$ is equal to the thickness of the heat spreading layer, T, divided by the distance D, as defined above. There will be an angle $\phi$ for every edge of the semiconductor chip. Angle $\phi 1$ is the angle defined using the smallest distance, $D_1$; angle $\phi 2$ is the angle defined using the largest distance, $D_2$. Angle $\phi$ave is the average value of $\phi 1$ and $\phi 2$. For the assembly of the invention, one of the following relationships must hold:

(1) T=5–9 mils and $\phi$ave=2° to 3°,
(2) 9<T<15 mils and $\phi$ave=4° to 9°, or
(3) T=15–20 mils and $\phi$ave=7° to 8°.

Figure 2D:
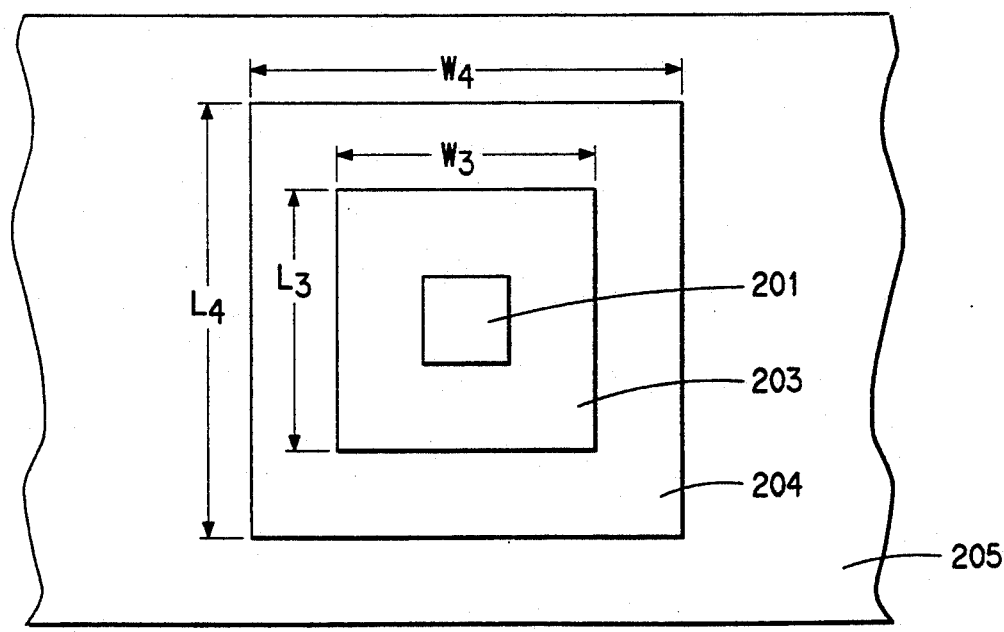
FIG. 2d is a second planar view of the same embodiment of the assembly of the invention.

FIG. 2d is a second planar view of the same structure which illustrates the electrical discharge safety border more clearly. The numbers in this figure refer to the same materials as in FIG. 2a. In FIG. 2d it is clear that both the length and width of the heat spreader 203 (L3 and W3, respectively) are smaller than the corresponding length and width of the dielectric layer 204 (L4 and W4). It is preferred that the electrical discharge safety border, i.e., the difference between L3 and L4 and the difference between W3 and W4, be at least as large as three times the thickness of layer 203 or 0.005 inches (0.013 cm), whichever is larger.

FIG. 2d is a planar view and directly shows surface areas of the various components. In the case of the semiconductor chip 201 the surface area can be expressed as $A_C$. Underlying the chip is a heat spreading layer 203 which has a thickness T and a surface area $A_m$. Further underlying the heat spreading layer is a layer 204 which is a single adhesive dielectric layer and has an area $A_d$. As further shown in FIG. 2d, a metal heat sink layer 205 is present with a surface area $A_S$.

Figure 3:
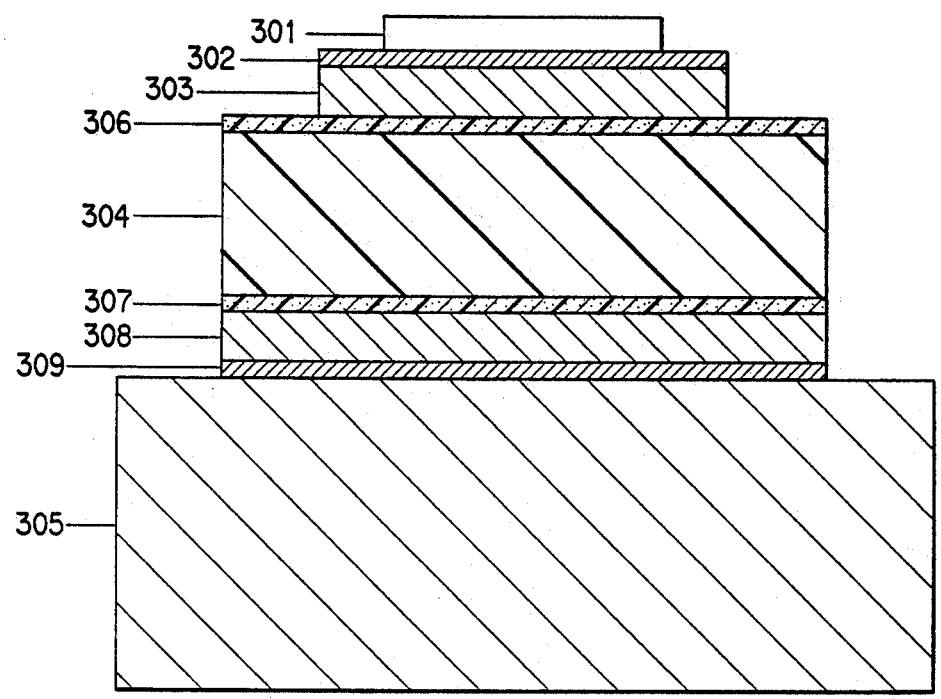
FIG. 3 is a cross-sectional view of a second embodiment of the assembly of the invention.

FIG. 3 is a cross-sectional view of a second embodiment of the invention. In this embodiment a dielectric-copper laminate is used to provide both the heat spreading layer and the dielectric layer. Semiconductor chip 301 is attached by means of solder 302 to copper heat spreading layer 303. The heat spreader 303 is attached to a dielectric film layer 304 by means of adhesive layer 306. On the other side of the dielectric film 304 is a second layer of adhesive 307 and a second layer of copper 308. This is then attached to the heat sink 305 by a joining layer 309. The dielectric-copper laminate used to prepare this structure is a double sided laminate consisting of layers 303, 306, 304, 307, and 308. Layer 304 is typically a polyimide film. Layers 306 and 307 can be any adhesives commonly used to form laminates. Typically crosslinked acrylic resins or fluoropolymer resins such as Teflon® PFA are used. Copper layer 303 is etched to be smaller than layers 306 and 304 thus providing the electrical discharge safety border. The laminate is then plated up with copper until the desired thickness for layer 303 is obtained. The laminate is then attached to heat sink 305 using a joining layer 309 to attach layer 308 to 305. The joining layer 309 is typically solder if the heat sink 305 is copper, or epoxy if the heat sink 305 is aluminum. In effect, copper layer 308 becomes part of the heat sink and layers 306, 304 and 307 function as the dielectric layer.

Figure 4:
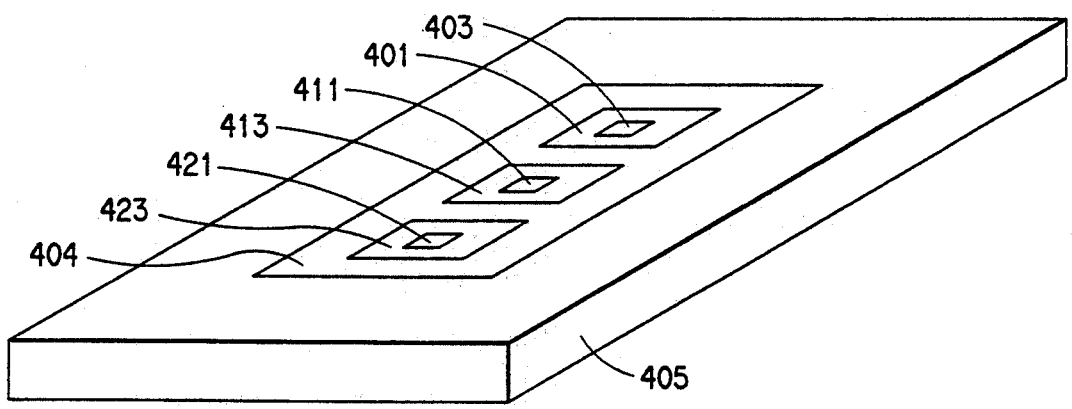
FIG. 4 is a planar view of a third embodiment of the assembly of the invention.

FIG. 4 is a planar view of a third embodiment of the invention in which more than one semiconductor is mounted on the same heat sink. Semiconductor chips 401, 411 and 413 are mounted on heat spreaders 403, 413 and 423, respectively. The heat spreaders are all attached to a single dielectric layer 404 which is attached to the heat sink 405.

EXAMPLES

The following examples further illustrate the invention.

Test Procedure

Thermal resistance in °C./watt was measured and then converted to thermal conductance as an indication of the structure's ability to conduct heat. To do this a thermal semiconductor test chip was used. The test chip was 0.200 by 0.200 inches (0.508 by 0.508 cm) and contained a diode and a resistor circuit. Power was dissipated by the resistor which resulted in an increase in the temperature of the chip. This temperature increase caused a decrease in the voltage across the chip diode. The voltage drop across the diode was about 2 mV per °C. rise in temperature. This voltage change was used to calculate the temperature change of the chip. Knowing the power dissipated and the increase in temperature, thermal resistance could be calculated. The power level was set at 6.805 watts.

The test substrate was attached to the heat sink and the thermal test chip was soldered on top of the test sample. This assembly was mounted on a thermochuck which was maintained at 40° C. Thermal grease and clamps were used to hold the assembly firmly to the thermochuck. The temperature of the heat sink was monitored by a thermocouple which was embedded in the thermochuck. Four probes, which could be moved independently, were connected to the chip-two probes for measuring the voltage across the diode and two probes were connected across the resistor. The test system consisted of a computer which was connected to a power supply and a Data Acquisition Unit (DAU).

The power supply provided the current through the chip resistor. The DAU supplied constant current to the diode circuit and measured voltage readings from the diode circuit and temperature using the thermocouple. Current was passed through the resistor for 60 seconds. Experimental data were stored in the computer. Values of the thermal resistance were calculated and displayed on the screen. Thermal conductance was calculated as the inverse of the thermal resistance in watts/°C.

Examples 1-8 and Comparative Examples A-D

Substrates were prepared with the structure shown in FIG. 3. The dielectric film layer 304 was 2 mil (0.005 cm) thick polyimide. The adhesive layers 306 and 307 were either Pyralux ® WA acrylic adhesive (E. I. du Pont de Nemours and Company, Wilmington, Del.) or Teflon ® PFA fluoropolmer (E. I. du Pont de Nemours and Company, Wilmington, Del.) as indicated in the table below. The acrylic adhesive had a thickness of from 0.3 to 1 mil (0.00085 to 0.0025 cm). The fluoropolymer adhesive had a thickness in the range of 0.1 to 0.2 mils (0.00025 to 0.0005 cm). Copper layers 303 and 308 were initially 2 oz copper foil. The assembly of copper-adhesive-polyimide-adhesive-copper was laminated at 182° C. and 200 psi for 60 minutes. Copper layers 303 and 308 were electroplated to the total thickness indicated in the table below. The heat spreader layer 303 had a surface area ranging from 0.13 to 0.25 sq. inches 0.84 to 1.6 sq. cm.) which was considerably greater than that of the semiconductor chip (0.04 sq. inches or 0.26 sq. cm.). the laminate was mounted onto a copper heat sink 305 which was 2.0×2.0×0.50 inches (5.0×5.0×1.3 cm) using 60/40 Sn/Pb solder. The semiconductor test chip 301 was attached to the copper heat spreader 303 using 25/75 Sn/Pb solder 302. (Copper layer 308 was effectively part of the heat sink layer, 305.)

The different samples were tested as described above. The test results are given in the table below.

| Ex. | Dielectric | Heat Spreader | | | | Thermal Conductance |
|---|---|---|---|---|---|---|
| | | W | L | T | φave | |
| 1 | WA | 0.47 | 0.47 | 7.0 | 3.0 | 0.272 |
| 2 | WA | 0.50 | 0.50 | 7.0 | 2.7 | 0.243 |
| 3 | WA | 0.36 | 0.36 | 12.5 | 8.8 | 0.235 |
| 4 | WA | 0.35 | 0.50 | 12.5 | 7.1 | 0.231 |
| 5 | PFA | 0.47 | 0.47 | 12.5 | 5.3 | 0.272 |
| 6 | PFA | 0.50 | 0.50 | 12.5 | 4.7 | 0.282 |
| 7 | PFA | 0.47 | 0.47 | 18.5 | 7.8 | 0.246 |
| 8 | PFA | 0.50 | 0.50 | 18.5 | 7.0 | 0.267 |
| A | PFA | 0.36 | 0.36 | 7.0 | 5.0 | 0.196 |
| B | PFA | 0.35 | 0.50 | 7.0 | 4.0 | 0.215 |
| C | A | 0.36 | 0.36 | 18.5 | 13.0 | 0.178 |
| D | WA | 0.35 | 0.50 | 18.5 | 10.4 | 0.220 |

T = thickness of the heat spreader in mils
W = width of heat spreader in inches
L = length of heat spreader in inches
PFA = Teflo ® PFA film
WA = Pyralux ® WA film
Thermal conductance in watts/°C.

It can be seen from the above that the assemblies of the invention (Examples 1-8) have consistently higher values for thermal conductance when compared to those assemblies which are outside the invention (Comparative Examples A-D). It also can be seen that the preferred thickness range for the heat spreader, 9-15 mils, provides more latitude in the range of φ values which result in good thermal conductance.

Example 9

For this example, the substrate shown in FIG. 2a was prepared and thermally conductive acrylic adhesive was used for dielectric layer 204.

A. Preparation of Thermally Conductive Adhesive

A copolymer latex was prepared using standard polymerization techniques. The copolymer had 59% by weight butylacrylate, 36% by weight acrylonitrile and 5% by weight methacrylic acid. The crosslinking agent was a phenol formaldehyde resin (Ucar ® BRL-1100, Union Carbide, Danbury, CT) at a level of 5% by dry weight based on the latex dry components.

The adhesive compositions were prepared by mixing 500 g of the copolymer latex, 157.4 g of alumina particles and 150 g of distilled water. The alumina used was Sumitomo AKP-15 spherical alumina which has an average particle size of 1.5 micrometers and is alkoxide derived (Sumitomo Chemical Co., New York, N.Y.). The mixtures were milled in an attritor coating 1.6-2.5 mm zirconium/silica mini-beads for 2 hours at 1.5 rpm. The resulting dispersion was filtered through a 400 mesh screen, with no obvious solids remaining on the screen.

B. Preparation of Substrate

A substrate was prepared having the structure shown in FIG. 2a. The heat spreader 203 was copper. It was 12.5 mils (0.032 cm) thick with a surface that was 0.470×0.480 inches (1.19×1.22 cm), i.e., a surface area of 0.2256 square inches (1.46 square cm). The value of φave was 5.2°. The dielectric layer 204 was a 2 mil (0.0051 cm) thick layer of the thermally conductive adhesive from A above having a surface that was 0.490×0.500 inches (1.24×1.27 cm), i.e., a surface area of 0.235 square inches (1.51 square cm). The heat sink 205 was aluminum having the dimensions 2.75×3.25×0.125 inches (6.99×8.26×0.318 cm). The dielectric layer 204 was placed between the copper heat spreader 203 and the aluminum heat sink 205 and the assembly was laminated together at as in Examples 1-12. The semiconductor test chip 301 was attached to the copper heat spreader 303 using 25/75 Sn/Pb solder 302.

The substrate assembly was tested as described above. The thermal conductance was 0.483 W/° C.

Comparative Example E

A prior art substrate using toxic beryllia, as shown in FIG. 1, was tested for comparison. The thicknesses of the various layers were as follows:

| | | |
|---|---|---|
| chip 1 | 22 mils | (0.056 cm) |
| solder 2 | 3 mils | (0.0076 cm) |
| Mo—Mn 3 | 0.3 mils | (0.00076 cm) |
| beryllia 4 | 25 mils | (0.064 cm) |
| copper 5 | 32 mils | (0.081 cm) |
| aluminum 6 | 64 mils | (0.165 cm) |

The measured thermal conductance of the substrate assembly was 1.130 W/° C. Although this is still higher than that obtained in Example 13, the thermal condutance of Example 13 is large enough to be commercially useful, and does not require the use of toxic materials.

What is claimed is:

1. An electronic assembly comprising in order:
   (a) a semiconductor chip having a surface area $A_C$,
   (b) a metal heat spreading layer having a first edge and a second edge, said heat spreading layer having a thickness T and a surface area $A_M$, where $A_M > A_C$, (c) a layer of an electrically insulating dielectric material having a surface area $A_D$, where $A_D > A_M$, and (d) a metal heat sink layer having a surface area $A_S$, where $A_S > A_D$, wherein said chip is located at a distance $D_1$ from the first edge of the metal heat spreading layer and a distance $D_2$ from the second edge of the metal heat spreading layer and angles $\phi_1$, $\phi_2$ and $\phi_{ave}$ are defined by the relationships $$\tan \phi_1 = \frac{T}{D_1}$$

$$\tan \phi_2 = \frac{T}{D_2}$$

$$\phi_{ave} = 1/2[\phi_1 + \phi_2]$$

wherein angle $\phi$ is the angle inscribed by (1) a line from an edge of the chip to the edge of an upper surface of the heat spreading layer, which is parallel to a surface of the heat spreading layer, and (2) a line connecting an edge of the chip to an edge of a lower surface of the heat spreading layer, angle $\phi_1$ is the angle using the smallest distance, $D_1$ and angle $\phi_2$ is the angle using the largest distance $D_2$ and further wherein one of the following dimensional relationships exists:

(1) T=5–9 mils and $\phi_{ave}$=2° to 3°, (2) 9>T>15 mils and $\phi_{ave}$=4° to 9°, or (3) T=15–20 mils and $\phi_{ave}$=7 to 8°.

2. The assembly of claim 1 wherein the semiconductor chip has a surface area $A_C$ in the range of about 0.064 square cm to about 1.0 square cm.

3. The assembly of claim 1 wherein the metal heat spreading layer comprises copper.

4. The assembly of claim 1 wherein the metal heat spreading layer has a thickness in the range of about 9 to about 15 mils.

5. The assembly of claim 1 wherein the metal heat spreading layer has a length and a width and the layer of dielectric material has a length and a width, and further wherein both the length and the width of the metal heat spreading layer are smaller than the corresponding length and width of the layer of dielectric material.

6. The assembly of claim 1 wherein the dielectric material of layer (c) comprises a thermally conductive crosslinked acrylic adhesive.

* * * * *